(12) United States Patent
Osakabe et al.

(10) Patent No.: US 7,218,379 B2
(45) Date of Patent: May 15, 2007

(54) SCANNING EXPOSURE APPARATUS AND METHOD

(75) Inventors: Yuichi Osakabe, Tochigi (JP); Yoshinori Ohsaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/130,174

(22) Filed: May 17, 2005

(65) Prior Publication Data

US 2005/0219487 A1    Oct. 6, 2005

Related U.S. Application Data

(62) Division of application No. 10/726,541, filed on Dec. 4, 2003, now Pat. No. 6,989,885.

(30) Foreign Application Priority Data

Dec. 6, 2002    (JP)    .............................. 2002-355685

(51) Int. Cl.
G03B 27/42    (2006.01)
G03B 27/58    (2006.01)
G03B 27/62    (2006.01)
G01B 11/00    (2006.01)

(52) U.S. Cl. ............................ 355/53; 355/72; 355/75; 356/401

(58) Field of Classification Search ................. 355/53, 355/72, 75, 77; 356/399, 400, 401
See application file for complete search history.

(56) References Cited

U.S. PATENT DOCUMENTS

| | | | | |
|---|---|---|---|---|
| 5,751,404 | A | 5/1998 | Murakami et al. | ............ 355/53 |
| 5,920,378 | A | 7/1999 | Murakami et al. | ............ 355/53 |
| 6,023,320 | A | 2/2000 | Kawashima | ................. 355/53 |
| 6,040,909 | A | 3/2000 | Hasegawa et al. | .......... 356/375 |
| 6,278,514 | B1 | 8/2001 | Ohsaki | ........................ 355/55 |
| 6,532,056 | B2 | 3/2003 | Osakabe et al. | .............. 355/53 |
| 6,646,714 | B2 | 11/2003 | Ohsaki | ....................... 355/52 |
| 6,649,484 | B2 | 11/2003 | Ohsaki | ...................... 438/401 |
| 6,683,673 | B2 | 1/2004 | Osakabe et al. | .............. 355/53 |
| 6,989,885 | B2 * | 1/2006 | Osakabe et al. | .............. 355/53 |

FOREIGN PATENT DOCUMENTS

| | | |
|---|---|---|
| JP | 9-298147 | 11/1997 |
| JP | 10-79340 | 3/1998 |

* cited by examiner

*Primary Examiner*—Alan Mathews
(74) *Attorney, Agent, or Firm*—Fitzpatrick, Cella, Harper & Scinto

(57) ABSTRACT

A scanning exposure apparatus for exposing a substrate (8) to a pattern with an original (1) through a projection optical system (5), while scanning the original and the substrate, includes a first detection system (14*c*) which detects a first substrate reference mark (18*c*1, 18*c*3) corresponding to the substrate through the projection optical system on/at at least one of an optical axis of the projection optical and an off-axis position shifted from the optical axis in a scanning direction, and an alignment system (2, 9) which aligns the original and the substrate on the basis of a detection result of the first detection system.

20 Claims, 13 Drawing Sheets

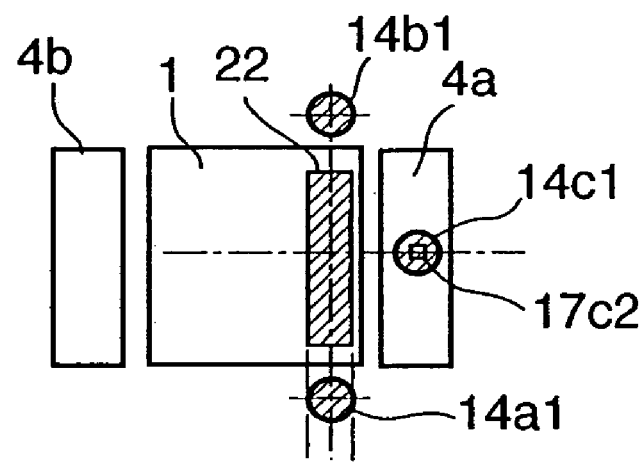
FIG. 11A
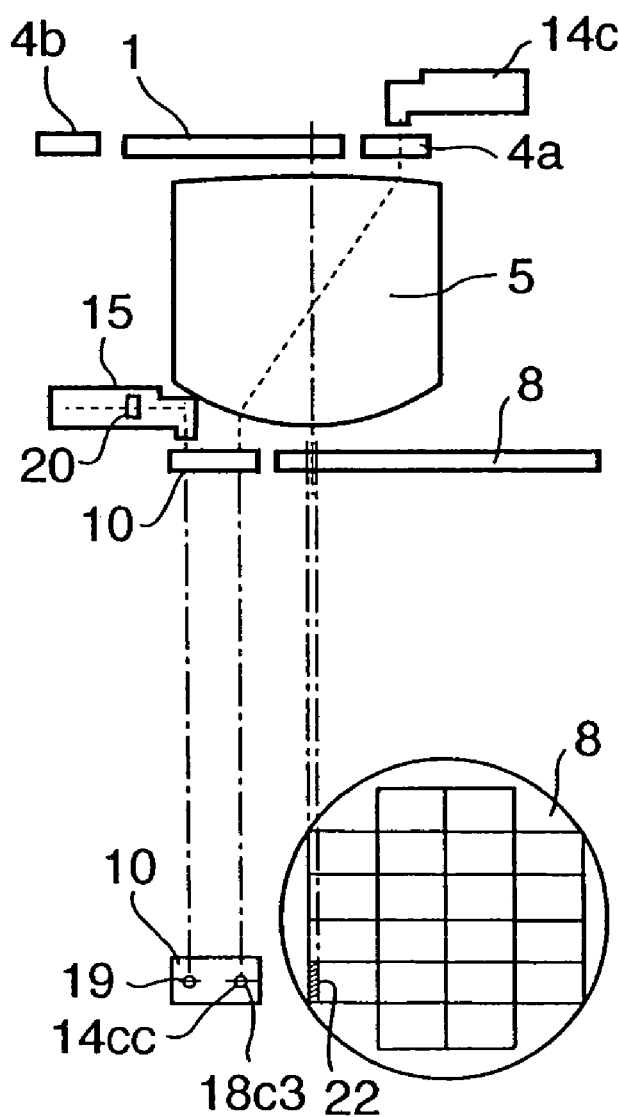
FIG. 11B
FIG. 11C

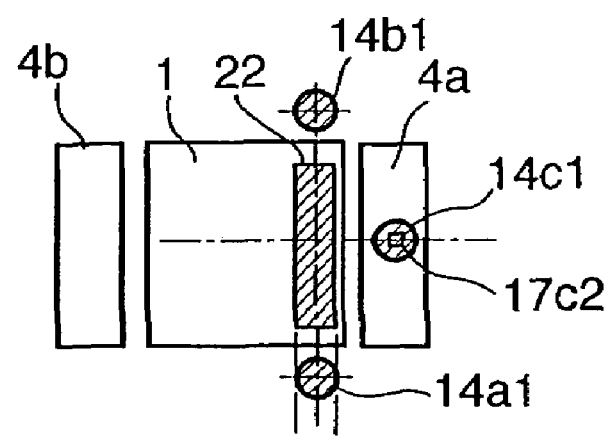
FIG. 12A
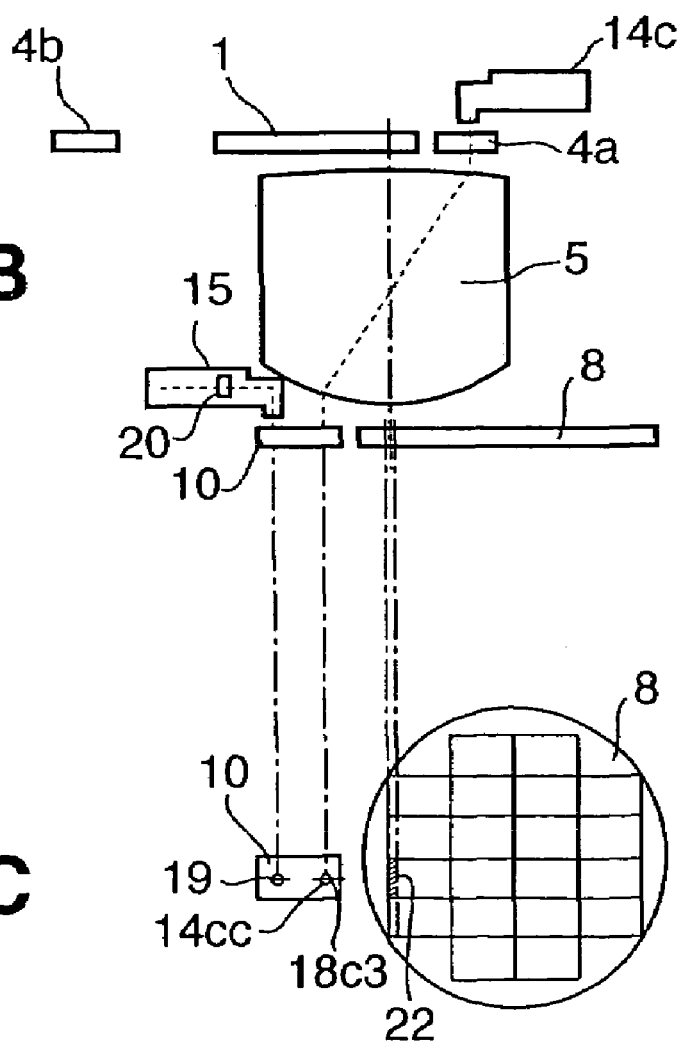
FIG. 12B
FIG. 12C

SCANNING EXPOSURE APPARATUS AND METHOD

This application is a divisional application of patent application Ser. No. 10/726,541, filed on Dec. 4, 2003 now U.S. Pat. No. 6,989,885.

FIELD OF THE INVENTION

The present invention relates to a technique for exposing a substrate to a pattern.

BACKGROUND OF THE INVENTION

A conventional scanning exposure apparatus forms and projects the image of a pattern of an original (reticle or photomask) onto a substrate (wafer) through a projection optical system, and scans (moves) the original and substrate simultaneously with respect to the projection optical system.

FIG. 3 is a perspective view showing the schematic arrangement of the conventional scanning exposure apparatus. FIG. 4 is a front view showing the schematic arrangement of the conventional scanning exposure apparatus.

An original 1 (reticle) is held by an original stage 2 which is driven in a Y direction in FIG. 3 by a laser interferometer 3 and a drive control means (not shown).

In the vicinity of the original 1, reference originals 4a and 4b are fixed within a predetermined range of the original stage 2. The reflection surfaces of the reference originals 4a and 4b are almost flush with the reflection surface of the original 1. A plurality of original reference marks made of a metal such as Cr or Al are formed on the reflection surfaces of the reference originals 4a and 4b serving as reference portions.

The original stage 2 is driven while its position in a Z direction in FIG. 3 is held constant with respect to a projection optical system 5. A moving mirror 6 which reflects a beam emitted from the laser interferometer 3 is fixed to the original stage 2. The laser interferometer 3 measures the position and moving amount of the original stage 2 successively.

A predetermined pattern formed on the original 1 is illuminated by exposure light emitted from an illumination optical system 7, and is projected through the projection optical system 5 to form an image on a substrate 8 (wafer) held by a substrate stage 9.

In the vicinity of the substrate 8, a reference substrate 10 is fixed within a predetermined range of the substrate stage 9. The reflection surface of the reference substrate 10 is almost flush with the upper surface of the substrate 8. A plurality of substrate reference marks made of a metal such as Cr or Al are formed on the reflection surface of the reference substrate 10.

The substrate stage 9 has a drive control means (not shown) for rotatably driving the substrate 8 or reference substrate 10 during vertical driving, image surface blur correction driving, alignment and yawing control of the substrate 8 or reference substrate 10, so that the substrate 8 coincides with the image surface of the projection optical system. Furthermore, a moving mirror 12 which reflects a beam from a laser interferometer 11 is fixed to the substrate stage 9. The laser interferometer 11 measures the position and moving amount of the substrate stage 9 successively.

With the above arrangement, the substrate stage 9 can move in the direction of the optical axis (Z direction) of the projection optical system 5 and within a plane (X-Y plane.) perpendicular to the direction of the optical axis, and can be rotated (θ direction) about the optical axis.

The original 1 and substrate 8 are placed at optically conjugate positions through the projection optical system 5 by a plurality of position detection means. The illumination optical system 7 forms a slit-like exposure region or arcuate exposure region elongated in the X direction on the original 1. The exposure region on the original 1 forms a slit-like exposure region, having a size substantially proportional to the projection magnification of the projection optical system 5, on the substrate 8.

In the above scanning exposure apparatus, both the original stage 2 and substrate stage 9 are driven with respect to the optical path of the exposure light at a speed ratio corresponding to the optical magnification of the projection optical system 5, to scan the exposure region on the original 1 and that on the substrate 8, thus performing scanning exposure.

An oblique incident scheme first position detection means 13 is provided as a focal plane position detection means. The first position detection means 13 irradiates the surface of the substrate 8 (or the surface of the reference substrate 10), where the pattern of the original 1 is to be transferred by the projection optical system 5, in an oblique direction with non-exposure light, and detects light reflected obliquely by the surface of the substrate 8 (or the surface of the reference substrate 10).

A plurality of position detection light-receiving elements corresponding to the respective reflected beams are provided to the first position detection means 13, and are arranged such that the light-receiving surfaces of the respective position detection light-receiving elements and the reflection points of the respective beams on the substrate 8 are substantially conjugate. Therefore, a positional error of the substrate 8 (or reference substrate 10) depending on the direction of the optical axis of the projection optical system 5 is measured as a positional error of the corresponding position detection light-receiving element in a detection unit.

When, however, the projection optical system 5 absorbs exposure heat or the ambient atmosphere changes, the focal position of the projection optical system 5 changes, and an error occurs in the measurement origin and focal plane of the oblique incident scheme first position detection means 13. A second position detection means 14 is loaded to calibrate this error.

As shown in FIG. 3, the second position detection means 14 has a first position detection system 14a and second position detection system 14b as two position detection systems. The two position detection systems 14a and 14b extract from the illumination optical system 7 light components having substantially the same wavelength as that of the exposure light, and guide them through fibers or lens optical systems. The guided light illuminates an in-focus mark on the reference original 4a or 4b (note that "a reference original 4" includes "the reference original 4a or 4b" unless otherwise specified).

At least one optical system in the second position detection means 14 is driven in the direction of the detection optical axis, and the detection focal plane of the second position detection means 14 is aligned with the in-focus mark on the reference original 4. Subsequently, the substrate stage 9 is vertically driven in the direction of the optical axis (Z direction) in the vicinity of the zero point which is preset by the oblique incident scheme first position detection means 13 in advance.

During driving, the reference substrate 10 is located substantially immediately under the projection optical system 5. Light transmitted through the in-focus mark of the reference original 4 is transmitted through the projection optical system 5 to irradiate the reference substrate 10. Light reflected by the reference substrate 10 is transmitted through the projection optical system 5 again to become incident on the light-receiving portion of the second position detection means 14 through the reference original 4.

The second position detection means 14 has detection ranges for the two position detection systems 14a and 14b on the X-axis including the optical path of the exposure light, as shown in FIG. 3, so that the means 14 estimates the actual exposure image surface from the two, left and right measurement points on the X-axis. The detection ranges of the first and second position detection systems 14a and 14b are arranged substantially symmetrically with respect to the optical path of the exposure light. The first and second position detection systems 14a and 14b are retracted so they do not shield the exposure light during exposure, and wait at retracted positions away from the exposure region.

The second position detection means 14 also serves as a position detection means which detects the positions of the reference original 4 and reference substrate 10 relative to each other. The detection results serve as elements for calculating the baselines of off-axis microscopes 15 and 16. A baseline is the distance between the center of a shot when aligning the substrate 8 and the center of a shot (optical axis of the projection optical system) for exposure. The off-axis microscope 15 is a non-TTL (Through The Lens) microscope which uses non-exposure light, and the off-axis microscope 16 is a TTL microscope which uses non-exposure light.

The off-axis microscopes 15 and 16 detect the position of an alignment mark on the substrate 8.

The detection scheme includes a scheme of illuminating the alignment mark with a laser beam or light emitted from a halogen lamp as a light source and having a wide wavelength band, and image-processing the image data of the sensed alignment mark, thus measuring the alignment mark, an interfering alignment scheme of irradiating a diffraction-grating-like alignment mark on the substrate with laser beams having the same frequency or slightly different frequencies in one or two directions, causing interference between the two diffracted light components, and measuring the position of the alignment mark from the phases of the two diffracted light components, and the like.

The outline of baseline measurement with the off-axis microscopes 15 and 16 in the conventional scanning exposure apparatus will be described.

According to baseline measurement of the conventional scanning exposure apparatus, the original stage 2 and substrate stage 9 are driven to predetermined positions, and the positions of the reference original 4 and reference substrate 10 relative to each other are detected by the second position detection means 14 (first step).

The reference substrate 10 is moved to the detection range of the off-axis microscope 15 or 16 by driving the substrate stage 9, and the position of the reference mark formed in the off-axis microscope 15 or 16 and the position of the reference mark on the reference substrate 10, which positions are relative to each other, are detected (second step).

The baseline of the off-axis microscope 15 or 16 is calculated from the detection results of the first and second steps, and the baseline of the off-axis microscope 15 or 16 is corrected with the calculation result (for example, see Japanese Patent Laid-Open Nos. 9-298147 and 10-79340).

Recently, the patterns of semiconductor integrated circuits are becoming largely integrated and shrinking in size more and more. To further improve the alignment accuracy and throughput of the entire apparatus, an increase in detection processing speed of various types of detection devices is required.

According to the prior art as described above, the two position detection systems 14a and 14b are mounted on the second position detection means 14 to perform measurement. This technique advances the limit for the recent technique of a larger integration degree and a smaller feature size.

During detection of the focal plane position using the second position detection means 14, as the actual exposure image surface is estimated from the two, left and right measurement values, the detection ranges of the two position detection systems 14a and 14b are formed coaxially on the right and left sides, as described above. Accordingly, with the conventional scanning exposure apparatus, baseline measurement and the like cannot be performed on the optical path of the exposure light, and may be adversely affected by distortion or the like caused by the aberration of the projection optical system.

In detection of the focal plane position, measurement must be performed as close as possible to the optical path of the exposure light. Hence, during exposure, the position detection system must be driven to retract from the exposure range. The detection time and detection accuracy may accordingly be adversely affected by driving.

With the conventional scanning exposure apparatus, since the two position detection systems 14a and 14b have the detection positions within the exposure slit, baseline measurement cannot be performed during exposure or at an exposure end position. Furthermore, in baseline measurement, the original stage 2 and substrate stage 9 must also be driven to predetermined baseline measurement positions. This poses an issue in the throughput of the entire apparatus.

As the patterns of the semiconductor integrated circuits or the like become largely integrated and shrink in size more and more, the NA of the projection optical system increases, and the outer shape of the projection optical system tends to become large. Accordingly, the non-TTL off-axis microscope provided in the vicinity of the projection optical system must be separated from the optical path of the exposure light. When the baseline becomes long in this manner, the baseline measurement accuracy decreases, and the alignment accuracy decreases.

As the wavelength of the exposure light becomes short, the transmittance of the exposure light with respect to an optical member decreases. Also, the exposure light quantity increases to improve the throughput of the entire apparatus. Therefore, the exposure light absorbed by the original increases, causing thermal deformation of the original. The conventional scanning exposure apparatus, however, does not have any position detection system that can detect the thermal deformation of the original during exposure.

SUMMARY OF THE INVENTION

In view of the above problems, it is an object of the present invention to realize at least one of high alignment or overlay accuracy and high throughput.

In order to solve the above problems and to achieve the above object, according to the present invention, a scanning exposure apparatus for exposing a substrate to a pattern of an original through a projection optical system, while scanning the original and the substrate, comprises a first detection system which detects a first substrate reference mark corresponding to the substrate through the projection optical system from at least one of an on-axis position on an optical axis of the projection optical and an off-axis position apart from the optical axis in a scanning direction and an alignment system which aligns the original and the substrate based on a detection result of the first detection system.

As described above, according to the present invention, at least one of high alignment or high overlay accuracy and high throughput can be realized.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIGS. 7A and 7B are views for explaining a measurement method in the scanning exposure apparatus according to the embodiment of the present invention, in which FIG. 7A is a layout view of the upper surface of the original stage, and FIG. 7B is a front view of the scanning exposure apparatus;

FIGS. 8A and 8B are views for explaining a measurement method in the scanning exposure apparatus according to the embodiment of the present invention, in which FIG. 8A is a layout view of the upper surface of the original stage, and FIG. 8B is a front view of the scanning exposure apparatus;

FIGS. 9A and 9B are views for explaining a measurement method in the scanning exposure apparatus according to the embodiment of the present invention, in which FIG. 9A is a layout view of the upper surface of the original stage, and FIG. 9B is a front view of the scanning exposure apparatus;

FIGS. 10A and 10B are views for explaining a measurement method in the scanning exposure apparatus according to the embodiment of the present invention, in which FIG. 10A is a layout view of the upper surface of the original stage, and FIG. 10B is a front view of the scanning exposure apparatus;

FIGS. 11A, 11B, and 11C are views for explaining a measurement method in the scanning exposure apparatus according to the embodiment of the present invention, in which FIG. 11A is a layout view of the upper surface of the original stage, FIG. 11B is a front view of the scanning exposure apparatus, and FIG. 11C is a layout view of the upper surface of a substrate stage;

FIGS. 12A, 12B, and 12C are views for explaining a measurement method in the scanning exposure apparatus according to the embodiment of the present invention, in which FIG. 12A is a layout view of the upper surface of the original stage, FIG. 12B is a front view of the scanning exposure apparatus, and FIG. 12C is a layout view of the upper surface of the substrate stage.

DETAILED DESCRIPTION OF THE PREFERRED EMBODIMENTS

Description of Practical Embodiment

Figure 1:
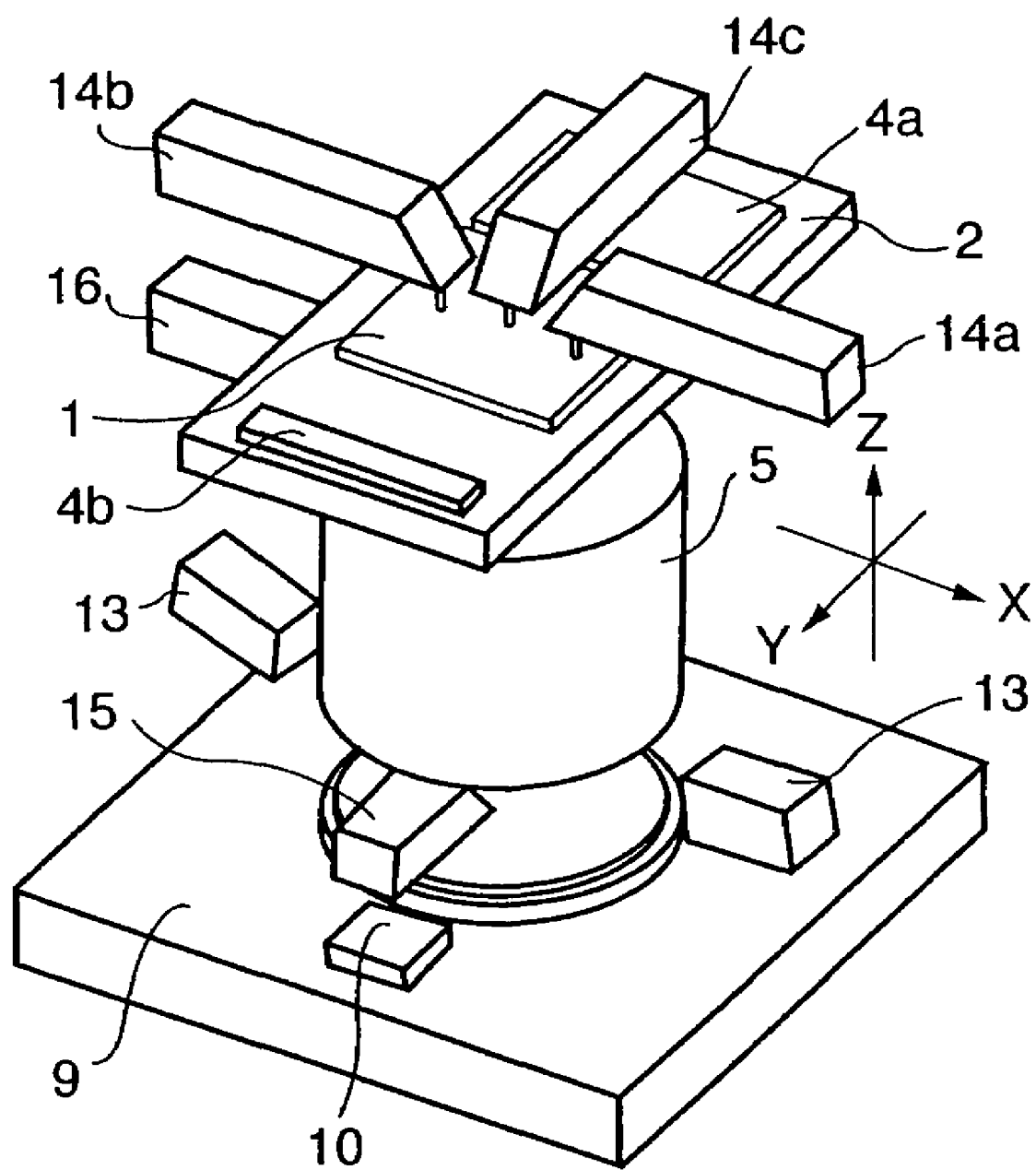
FIG. 1 is a perspective view of a scanning exposure apparatus according to an embodiment of the present invention.
Figure 3:
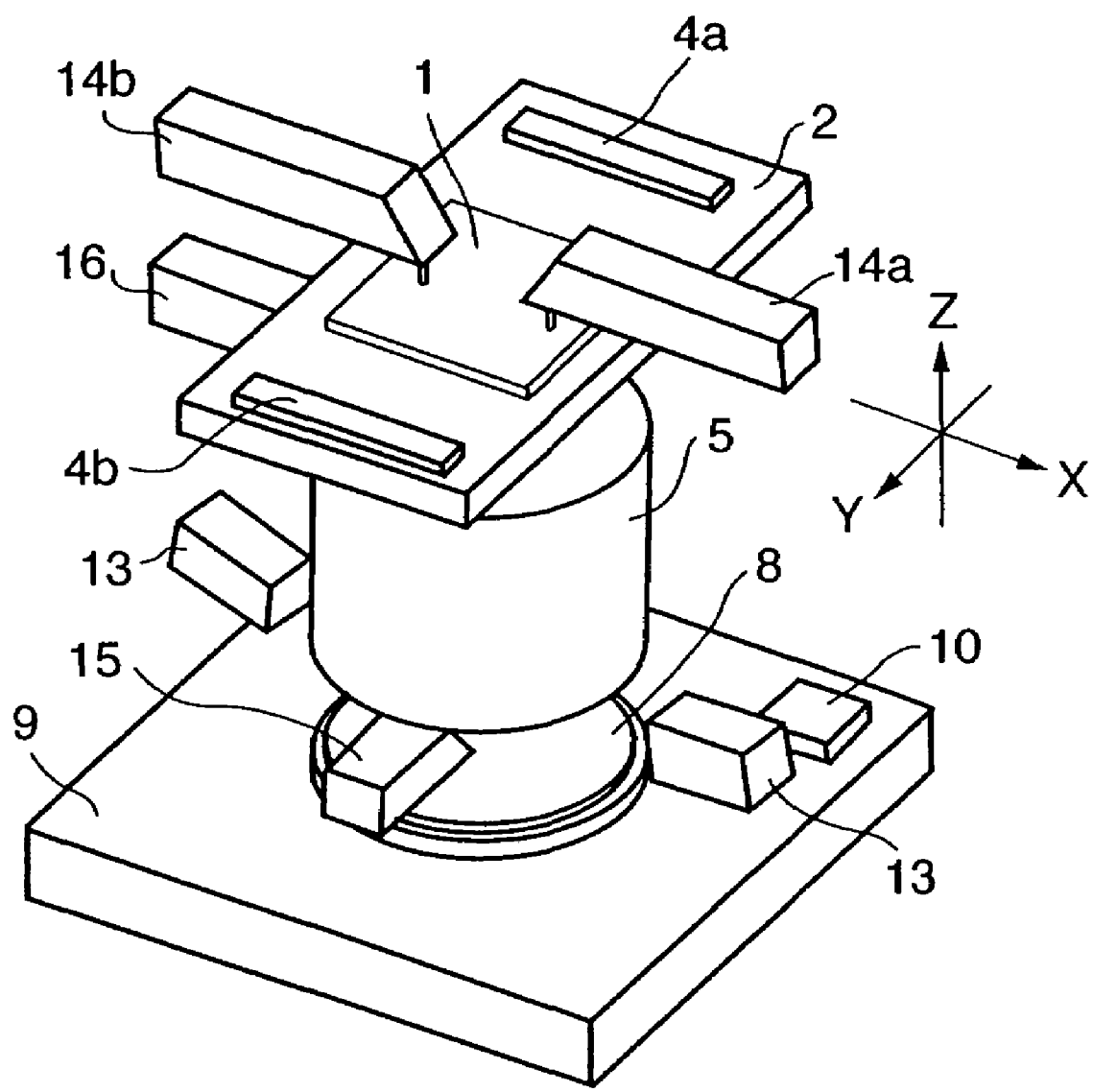
FIG. 3 is a perspective view of a conventional scanning exposure apparatus.
Figure 4:
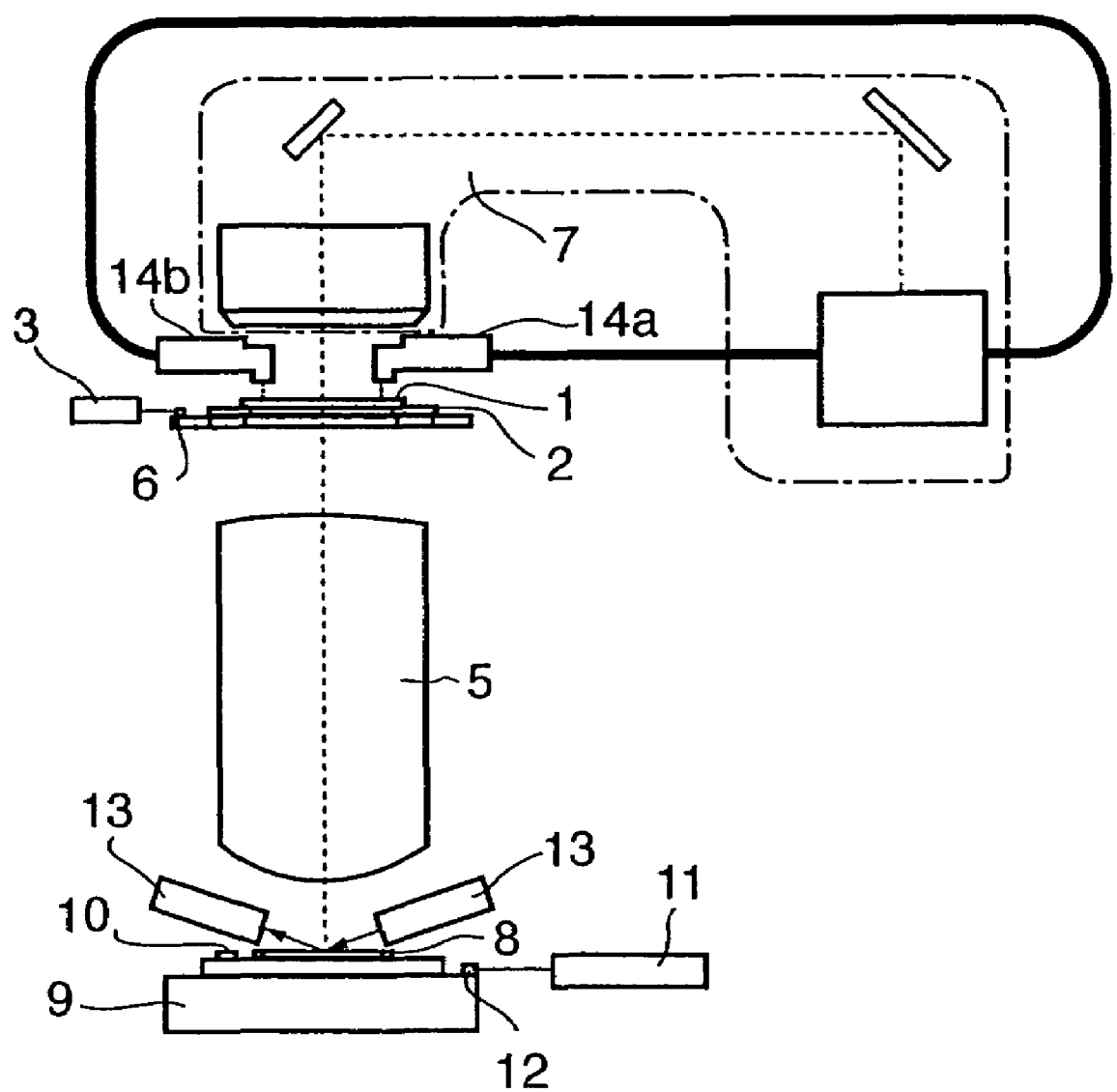
FIG. 4 is a front view of the conventional scanning exposure apparatus.

FIG. 1 shows the schematic arrangement of an exposure apparatus according to an embodiment of the present invention. For the descriptive convenience, the same members as those of the conventional apparatus shown in FIGS. 3 and 4 are denoted by the same reference numerals.

As shown in FIG. 1, in the scanning exposure apparatus of this embodiment, a first position detection system 14a, second position detection system 14b, and third position detection system 14c are provided as three or more position detection systems to a second position detection means 14.

The position detection systems 14a, 14b, and 14c have individual driving mechanisms for performing detection within arbitrary detection ranges. The first and second position detection systems 14a and 14b can move their detection ranges arbitrarily in a direction (X direction in FIG. 1) substantially perpendicular to the scanning direction of an original stage 2. The third position detection system 14c can move its detection range in a direction (Y direction in FIG. 1) substantially parallel to the scanning direction of the original stage 2.

When performing detection using the position detection systems described above, one, two or more (a plurality of), or all of arbitrary position detection systems can be selected. When calculating the position from the detection result of the selected position detection system, one, or two or more (a plurality of) detection results can be arbitrarily selected.

The detection ranges of the first and second position detection systems 14a and 14b are arranged to be substantially symmetrical with respect to the optical axis of exposure light. The third position detection system 14c can observe the optical path of the exposure light. When exposing the substrate to the pattern of the original, the respective position detection systems 14a, 14b, and 14c are set still at retracted positions where they do not shield the exposure light, or at positions where they do not shield the exposure light.

Figure 2:
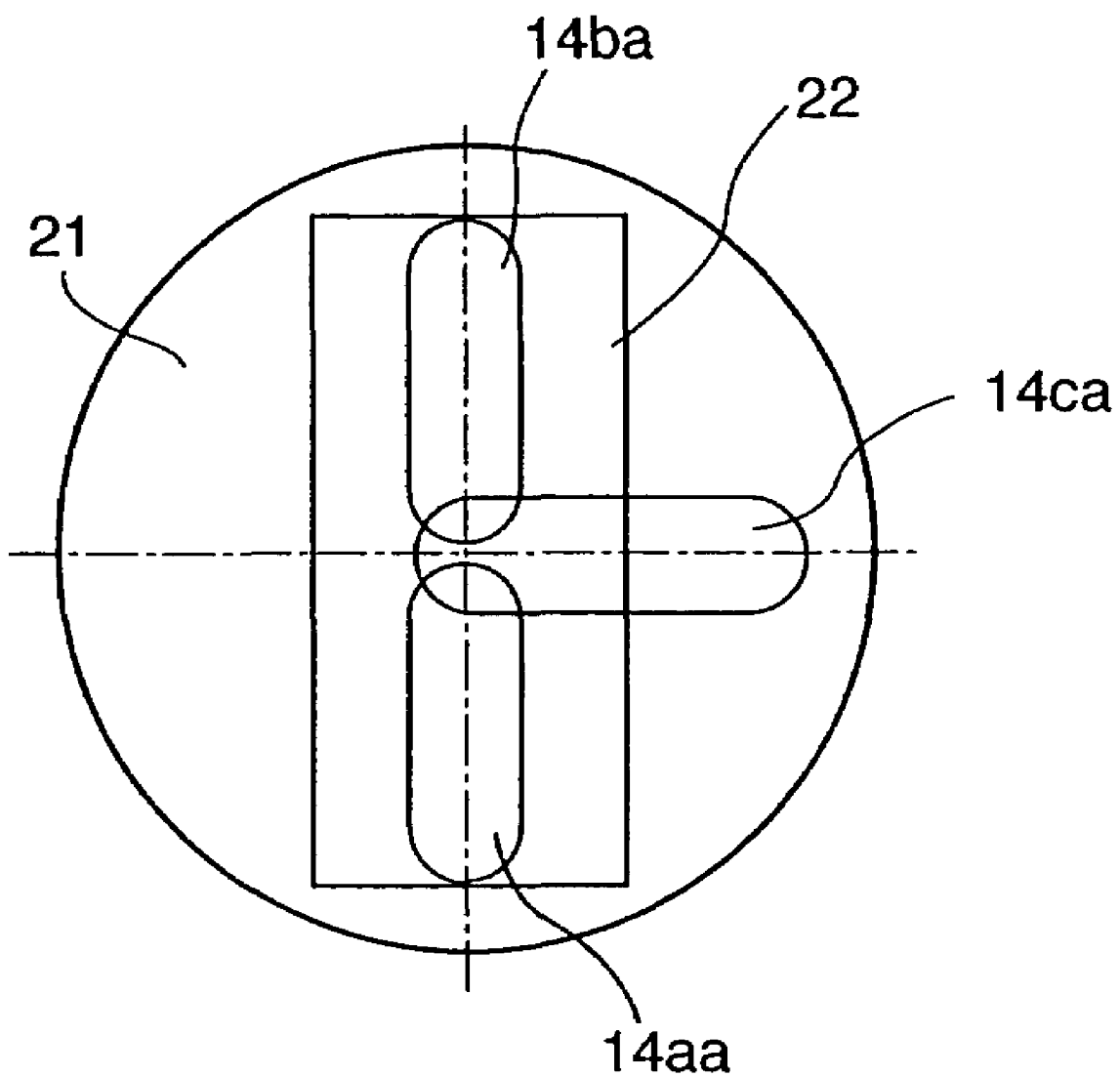
FIG. 2 is a schematic view showing the exposure region, and the detection region of the second position detection means, of the scanning exposure apparatus according to the embodiment of the present invention.

As shown in FIG. 2, the scanning exposure apparatus has a short slit-like or arcuate exposure illumination region 22 (exposure slit) in the Y direction (the scanning direction of the original stage 2). Since the third position detection system 14c of this embodiment can be driven to a detection position substantially parallel to the scanning direction of the original stage 2, it has a detection range 14ca even outside the exposure illumination region (exposure slit) 22, as shown in FIG. 2.

A plurality of position sensors are so provided to the respective position detection systems as not to interfere with them, and are controlled by drive control means (not shown).

The second position detection means 14 extracts from an exposure illumination optical system 7 three beams having substantially the same wavelength as that of the exposure light, and guides them to the position detection systems 14a, 14b, and 14c separately. The three beams are branched by a method of branching the exposure light into three beams in the exposure illumination optical system 7, a method of branching the exposure light into two beams in the exposure illumination optical system 7, further branching one of the two beams in the second position detection means 14, and guiding the resultant three beams to the respective position detection systems, a method of guiding one beam from the exposure illumination optical system 7, branching the beam into three beams in the second position detection means 14, and guiding the three beams to the respective position detection systems, or the like.

The light guiding method of the scanning exposure apparatus according to the present invention is not limited to the method described above. The light guiding method can have various arrangements not departing from the spirit of the present invention as far as it can guide the exposure light to the respective position detection systems.

The illumination optical system which guides light from the exposure illumination optical system 7 to the second position detection means 14 may guide the light through a flexible optical system such as a fiber, or through an optical system such as a lens or mirror. Particularly, in a scanning exposure apparatus that uses a short-wavelength laser such as KrF excimer laser ($\lambda$=248 nm), ArF laser ($\lambda$=193 nm), or $F_2$ laser ($\lambda$=158 nm) as exposure light, the exposure light attenuates largely. Thus, it is effective to guide the light within a space substantially sealed with an inert gas.

The respective position detection systems 14a, 14b, and 14c separately have attenuation glass members (not shown) capable of selecting the attenuation rates. Thus, a difference in light quantity among the position detection systems can be corrected or adjusted.

The number of position detection systems is not limited to three, but three or more position detection systems can be mounted. Of the three or more position detection systems, at least two or more, first and second position detection systems can move their detection ranges in a direction (the X direction in FIG. 1) substantially perpendicular to the scanning direction of the original stage 2 arbitrarily. Of the remaining position detection systems, at least one or more third position detection systems can move their detection ranges in a direction (the Y direction in FIG. 1) substantially parallel to the scanning direction of the original stage 2. Furthermore, at least one position detection system can observe the optical path of the exposure light.

Each of the position detection systems 14a, 14b, and 14c is not a single position detection system for the Y- or X-axis shown in FIG. 1, but observes at least one mark on an original 1, reference originals 4a and 4b, and a reference substrate 10. Each of the position detection systems 14a, 14b, and 14c individually observes the position of the mark in the X- and Y-directions.

In each position detection system, a method of detecting the X- and Y-axis directions with the same detection optical path, a method of detecting the X- and Y-axis directions separately with X- and Y-axis position detection system optical paths, respectively, or the like can be employed.

The reference original 4a has a plurality of original reference marks 17a1, 17b1, 17c1, and 17c2 which can be detected by the respective position detection systems of the second position detection means 14, with a predetermined known size and interval corresponding to the detection ranges of the respective position detection systems.

Figure 5:
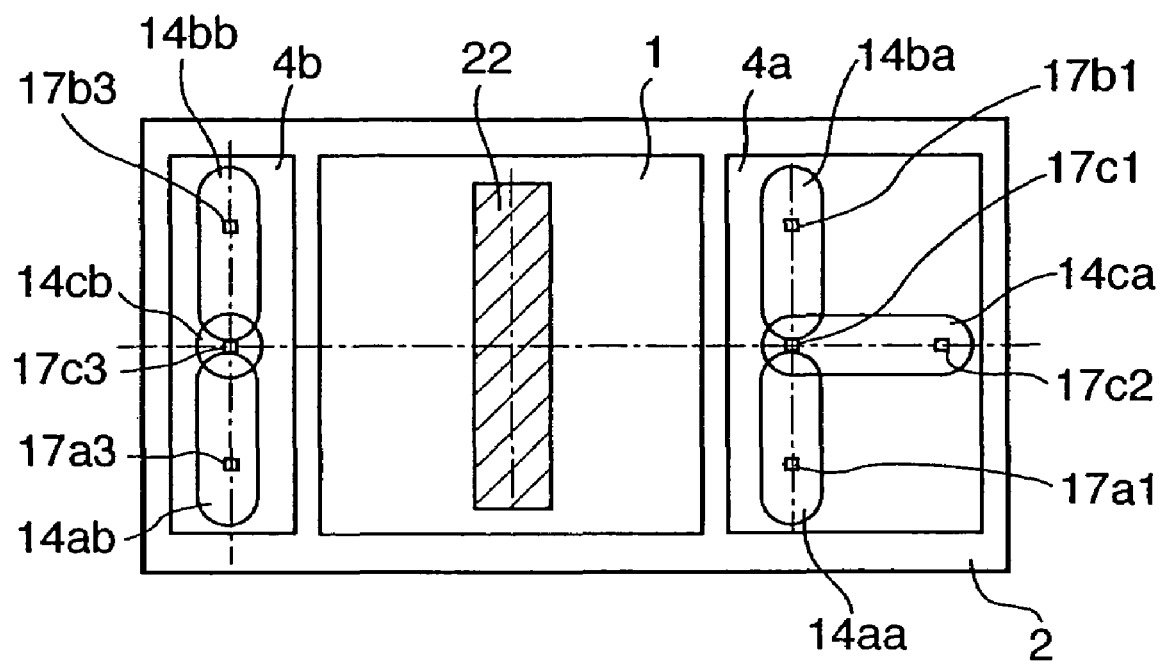
FIG. 5 is a layout view of the upper surface of the original stage of the scanning exposure apparatus according to the embodiment of the present invention.

The reference original 4a shown in FIG. 5 has the original reference mark 17a1 which can be observed by the first position detection system 14a, the original reference mark 17b1 which can be observed by the second position detection system 14b, and the original reference marks 17c1 and 17c2 which can be observed by the third position detection system 14c. The distances among the respective original reference marks relative to each other are set to have known sizes.

The original reference marks 17a1, 17b1, and 17c1 used for detection using the first, second, and third position detection systems 14a, 14b, and 14c are arranged in predetermined detection ranges 14aa and 14ba, and the detection range 14ca of the reference original 4a such that their mark array is substantially perpendicular to the scanning direction of the original stage 2.

The original reference marks 17c1 and 17c2 used for detection using the third position detection system 14c are arranged in the detection range 14ca of the third position detection system 14c of the reference original 4a such that their mark array extends in the scanning direction along the optical path of the exposure light of the original stage 2.

The reference original 4b has the plurality of original reference marks 17a3, 17b3, and 17c3 which can be detected by the respective position detection systems of the second position detection means 14, with a predetermined known size and interval in respective detection ranges 14ab, 14bb, and 14cb.

The reference original 4b shown in FIG. 5 has the original reference mark 17a3 which can be observed by the first position detection system 14a, the original reference mark 17b3 which can be observed by the second position detection system 14b, and the original reference mark 17c3 which can be observed by the third position detection system 14c. The distances among the respective original reference marks relative to each other are set to have known sizes.

The original reference marks 17a1 and 17a3 are arranged such that their mark array is substantially parallel to the scanning direction of the original stage 2. Similarly, the original reference marks 17b1 and 17b3; and 17c1 and 17c3 are arranged such that their mark arrays are substantially parallel to the scanning direction of the original stage 2.

The original reference marks may be separately, divisionally formed for the individual position detection systems. When considering the forming accuracy, the original reference marks are preferably formed on one plane-parallel glass plate, as shown in FIG. 5. Each original reference mark may include one or a plurality of original reference marks.

The reference substrate 10 serving as the reference portion has a plurality of substrate reference marks 18a1, 18b1, 18c1, 18a3, 18b3, and 18c3 which can be detected by the respective position detection systems of the second position detection means 14, with a predetermined known size and interval corresponding to the respective detection ranges.

Figure 6:
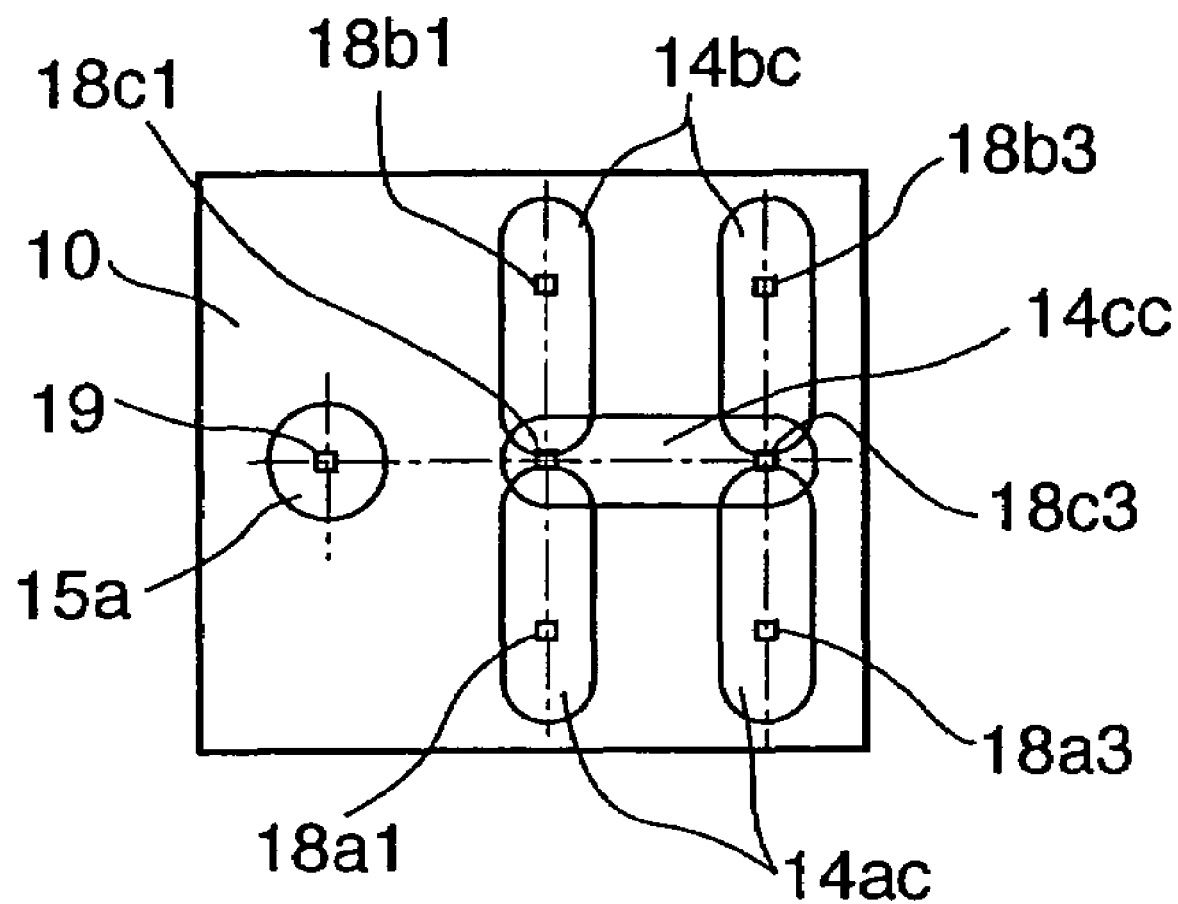
FIG. 6 is a layout view of the reference substrate marks of the scanning exposure apparatus according to the embodiment of the present invention.

The reference substrate 10 shown in FIG. 6 has the substrate reference marks 18a1 and 18a3 which can be observed by the first position detection system 14a, the substrate reference marks 18b1 and 18b3 which can be observed by the second position detection system 14b, and the substrate reference marks 18c1 and 18c3 which can be observed by the third position detection system 14c. The distances among the respective substrate reference marks relative to each other are set to have known sizes.

The substrate reference marks 18a1, 18b1, and 18c1 are arranged such that their mark array is substantially parallel to the X-driving direction of a substrate stage 9, and are arranged at the predetermined positions 14ac, 14bc, and 14cc which can be detected substantially simultaneously by the respective position detection systems. The substrate reference marks 18a1 and 18a3 are set such that their mark array is substantially parallel to the Y-driving direction of the substrate stage 9. Similarly, the substrate reference marks 18b1 and 18b3, and 18c1 and 18c3 are set such that their mark arrays are substantially parallel to the Y-driving direction of the substrate stage 9.

The reference substrate 10 has a substrate reference mark 19, which can be detected by an off-axis microscope 15, within a detection range 15a of the off-axis microscope 15.

The respective substrate reference marks are formed on the respective plates on the basis of their designed coordinates, and the relationship among their relative positions is known.

In the scanning exposure apparatus of this embodiment, as shown in FIG. 1, while the substrate stage 9 is being exposed, the reference substrate 10 is preferably located in a range, including the detection range of the off-axis microscope 15, between the optical axis of the projection optical system 5 and the detection range of the off-axis microscope 15, and the detection range of the third position detection system 14c with respect to the reference substrate 10 is preferably located in a range, including the detection range of the off-axis microscope 15, between the optical axis of the projection optical system 5 and the detection range of the off-axis microscope 15. In this case, a large effect can be obtained.

The off-axis microscope 15 in the scanning exposure apparatus according to this embodiment has a detection range at a position away from the optical axis of the projection optical system 5 in the Y-axis scanning direction.

[First Detection Method]

The scanning exposure apparatus according to this embodiment includes, as the first detection system of the second position detection means 14, a calibration detection method of detecting the origin position of the original stage 2. A measurement example of this method will be described (see FIG. 1 and FIGS. 7A and 7B).

Figure 7A:
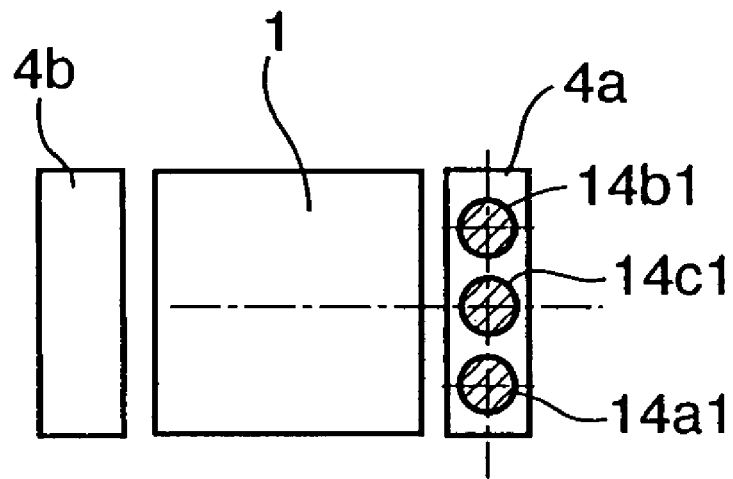
Figure 7B:
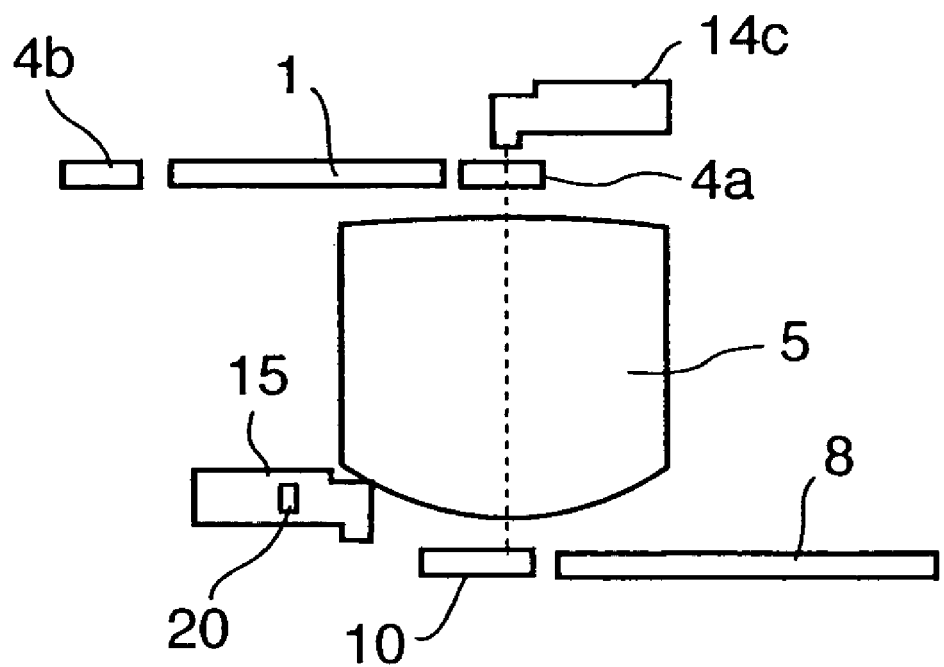
Figure 8A:
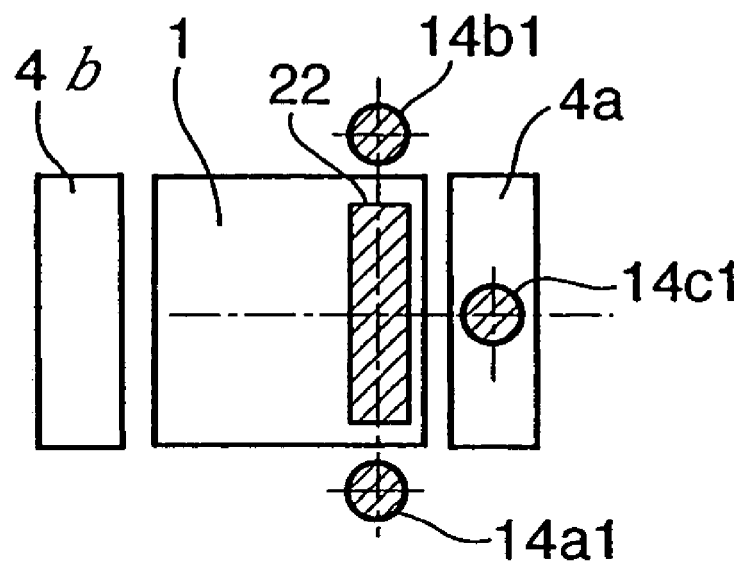
Figure 8B:
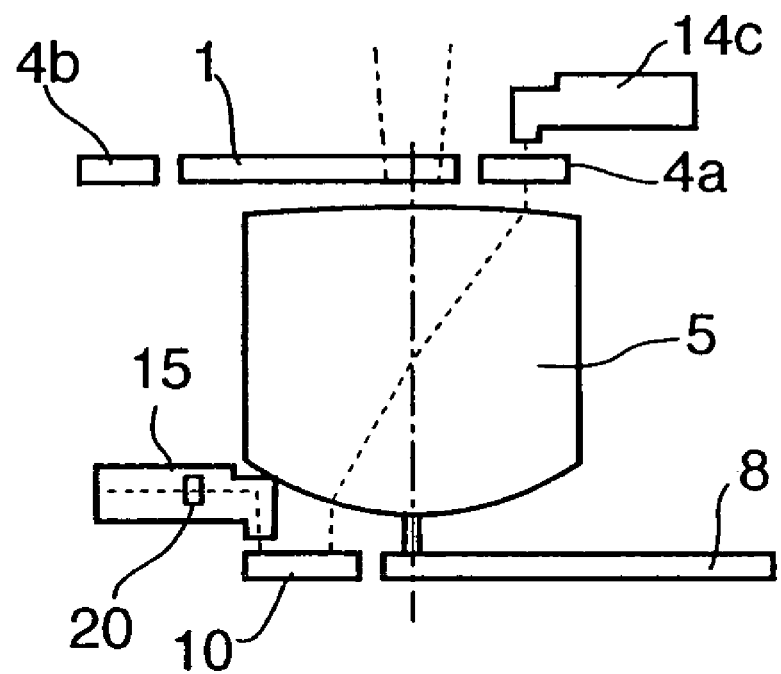

FIGS. 7A and 7B show the detection ranges of the first, second, and third position detection systems 14a, 14b, and 14c used when performing calibration detection described above.

Detection ranges 14a1, 14b1, and 14c1 of the first, second, and third position detection systems 14a, 14b, and 14c are set on a straight line substantially perpendicular to the scanning direction of the original stage 2. The detection range 14c1 of the third position detection system 14c substantially coincides with the optical path of the exposure light.

Assume that the measurement origin of a laser interferometer 3 is reset because, e.g., the apparatus power supply is turned off. When the apparatus power supply is turned on again, the third position detection system 14c is driven to the detection range 14c1 on the optical path of the exposure light. The original reference mark 17c1 on the reference original fixed to the original stage 2 is driven to the detection range 14c1 of the third position detection system 14c on the optical path of the exposure light by driving the original stage 2. In this case, the original stage 2 is driven with reference to a sensor provided to the guide of the original stage 2. The third position detection system 14c detects the error amount between the tube surface reference (attaching position) of the third position detection system 14c and the reference mark. The origin offset of the original stage 2 is calculated from this detection result.

The origin offset can be calculated not only from the detection result of the third position detection system 14c. Alternatively, the first, second, and third position detection systems 14a, 14b, and 14c may be used, as shown in FIG. 5, and the origin offset may be calculated from the respective detection results.

The scanning exposure apparatus according to the present invention can drive an arbitrary position detection system individually, and uses the detection result of the arbitrary position detection system for calculating the origin offset. Furthermore, for example, the detection results of the respective position detection systems may not be handled equally, but the origin offset may be calculated by placing a special emphasis on the detection result of the third position detection system 14c which is not influenced by the aberration of the projection lens.

[Second Detection Method]

The scanning exposure apparatus according to this embodiment includes, as the second detection method of the second position detection means 14, a detection method of detecting the error amount between the relative position of the optical path of the exposure light and that of the reference substrate in baseline measurement of the off-axis microscope. This measurement example will be described.

First Embodiment

Baseline measurement according to the first embodiment will be described hereinafter (see FIGS. 1, 5, and 6, and FIGS. 7A and 7B).

To perform this measurement, the third position detection system 14c is driven to the third position detection system detection range 14c1 on the optical path of the exposure light.

The original reference mark 17c1 formed on the reference original 4a is moved to the detection range 14c1 on the optical path of the exposure light by driving the original stage 2. The substrate reference mark 18c1 formed on the reference substrate 10 is moved to the detection range 14c1 on the optical path of the exposure light by driving the substrate stage 9.

The relative error amount between the original reference mark 17c1 and substrate reference mark 18c1 is detected by the third position detection system 14c (first step). When the first step is completed, the substrate reference mark 19 is moved to the detection range 15a of the off-axis microscope 15. The relative error amount between the substrate reference mark 19 and a microscope reference mark 20 which is fixed to the off-axis microscope 15 is detected (second step). The baseline of the off-axis microscope 15 is calculated from the detection results of the first and second steps, and baseline correction of the off-axis microscope is performed.

Second Embodiment

According to baseline measurement of the second embodiment (see FIGS. 1, 5, and 6, and FIGS. 7A and 7B), when the original reference mark 17c1 and substrate reference mark 18c1 are to be detected by the third position detection system 14c and the baseline of the off-axis microscope 15 is to be measured, the relative error amount between the original reference mark 17a1 and substrate reference mark 18a1 is detected by the first position detection system 14a, and the relative error amount between the original reference mark 17b1 and substrate reference mark 18b1 is detected by the second position detection system 14b substantially simultaneously, or separately.

The relative error amount between the original reference mark 17c1 and substrate reference mark 18c1 can be calculated not only from the detection result of the third position detection system 14c.

Alternatively, the relative error amount may be detected from the detection results of the respective position detection systems 14a, 14b, and 14c, and the baseline of the off-axis microscope 15 may be calculated at high precision.

The baseline correction of the off-axis microscope 15 is performed by utilizing the above calculation result. Furthermore, the baseline may be calculated not only by handling the detection results of the respective position detection systems 14a, 14b, and 14c equally. Alternatively, the baseline can be calculated by placing an emphasis on the result of the third position detection system 14c which receives the least influence of the aberration of, e.g., the projection optical system 5.

Third Embodiment

Baseline measurement according to the third embodiment will be described (see FIGS. 1, 5, and 6, and FIGS. 8A and 8B).

According to the baseline measurement of the third embodiment, in the third position detection system 14c, the wait position during exposure and the detection range substantially coincide.

According to baseline measurement of the third embodiment, as the third position detection system 14c can perform detection at the retracted position for exposure, when detection is to be performed by using the third position detection system 14c, the third position detection system 14c need not be driven to the detection position. Therefore, the driving time and the influence of the driving accuracy of the third position detection system 14c can be eliminated in baseline measurement, so that high-speed, high-accuracy baseline measurement can be performed. The baseline correction of the off-axis microscope 15 is performed by utilizing this measurement result.

Assume that the wait position for exposure and the detection range of the third position detection system 14c do not substantially coincide but are close to each other for a reason such as layout limitation. Even in this case, since the driving time and the influence of the driving accuracy of the third position detection system 14c decreases, a short measurement time and high measurement accuracy can be expected.

These effects are not limited to baseline measurement, but are obtained in various types of detection methods that use the third position detection system 14c.

Fourth Embodiment

Baseline measurement according to the fourth embodiment will be described (see FIGS. 1, 5, and 6, and FIGS. 8A and 8B).

According to this embodiment, while the original stage 2 or substrate stage 9, or both of them are not moved, the relative error amount between the original reference mark 17c1 and substrate reference mark 18c1 is detected by the third position detection system 14c, and the relative error amount between the substrate reference mark 19 and the microscope reference mark 20 of the off-axis microscope 15 is detected by the off-axis microscope 15.

Therefore, baseline measurement that does not require driving of the original stage 2 or substrate stage 9, or both of them is possible, and baseline measurement in which the driving time or the influence of the driving accuracy is eliminated or reduced can be performed at high speed and at high accuracy. The baseline correction of the off-axis microscope 15 is performed from this measurement result.

Assume that above detection without moving the substrate stage 9 cannot be performed for a reason such as layout limitation of the periphery of the projection optical system 5. In this case, the detection range of the third position detection system 14c may be set between the optical axis of the projection optical system 5 and the detection range of the off-axis microscope 15. Then, when performing baseline measurement, the substrate stage position when the third position detection system 14c is to be used and the substrate stage position when the off-axis microscope 15 is to be used can be set close to each other. Thus, the driving amount of the substrate stage 9 can be decreased, so that a short measurement time and high measurement accuracy can be expected.

Regarding the original stage 2, when performing baseline measurement, the original stage position when the third position detection system 14c is to be used and the original stage position during (at the end of) exposure can be set close to each other. Thus, the same effect as that described above can be expected.

Fifth Embodiment

Baseline measurement according to the fifth embodiment will be described (see FIGS. 1, 2, 5, and 6, and FIGS. 11A to 11C).

As shown in FIG. 11A, the detection range 14c1 of the third position detection system 14c substantially coincides with the detection possible range at the wait position for exposure, in the same manner as in the fourth embodiment.

At the exposure end position, the baseline measurement of the off-axis microscope 15 can be performed without driving the original stage 2, substrate stage 9, or third position detection system 14c.

The arrangement of this embodiment will be described in detail.

As shown in FIG. 2, the detection range of the third position detection system 14c is set not only within the exposure illumination region 22 but also outside it. Thus, even at the wait position for exposure, the third position detection system 14c can perform detection.

When the original stage 2 is scanned in scanning exposure, the original reference mark 17c2 of the reference original 4a is moved to the detection range 14c1 of the third position detection system 14c, as shown in FIG. 11A, so that it is arranged within a range where it can be detected when scanning exposure is ended.

As the substrate stage 9 is scanned in scanning exposure, the substrate reference mark 18c3 of the reference substrate 10 is arranged in a range where it can be detected by the third position detection system 14c when scanning exposure is ended, as shown in FIG. 11C.

Furthermore, the off-axis microscope 15, the substrate reference mark 19 on the reference substrate 10, and the substrate reference mark 18c3 are arranged such that the substrate reference mark 19 for the off-axis microscope 15 can be detected by the off-axis microscope 15 when scanning exposure is ended.

With the above arrangement, at the scanning exposure end position, the relative error amount between the original reference mark 17c2 and substrate reference mark 18c3 is detected by the third position detection system 14c without driving the original stage 2, substrate stage 9, or third position detection system 14c. The relative error amount between the substrate reference mark 19 and the microscope reference mark 20 which is fixed to the off-axis microscope 15 is detected. The baseline of the off-axis microscope 15 is calculated from these detection results.

According to this embodiment, baseline measurement can be performed at the exposure end position without driving the original stage 2, substrate stage 9, or third position detection system 14c. Thus, the throughput of the entire apparatus can be improved.

Regarding the measurement accuracy, since it does not include the influence of driving, high-accuracy detection and calculation can be performed.

Sixth Embodiment

Baseline measurement according to the sixth embodiment will be described (see FIGS. 1, 2, 5, and 6, and FIGS. 12A to 12C).

As shown in FIG. 12A, the detection range 14c1 of the third position detection system 14c substantially coincides with the detection possible range at the wait position for exposure. The positions of the reference original 4a and reference substrate 10 relative to each other can be detected by the third position detection system 14c at a predetermined position during exposure. Also, the reference substrate 10 can be detected by the off-axis microscope 15.

The arrangement of this embodiment will be described in detail.

As shown in FIG. 2, the detection range of the third position detection system 14c is set not only within the exposure illumination region 22 but also outside it. Thus, the third position detection system 14c can perform detection at the wait position for exposure.

When the original stage 2 is scanned in scanning exposure, the original reference mark 17c2 of the reference original 4a is moved to the detection range 14c1 of the third position detection system 14c, as shown in FIG. 12A, so that it is arranged within a range where it can be detected in a predetermined range during scanning exposure.

As the substrate stage 9 is scanned in scanning exposure, the substrate reference mark 18c3 of the reference substrate 10 is arranged in a range where it can be detected by the third position detection system 14c in a predetermined range during scanning exposure, as shown in FIG. 12C.

Furthermore, at this substrate stage position, the substrate reference mark 19 for the off-axis microscope 15 can be detected by the off-axis microscope 15.

With the above arrangement, in a predetermined range during scanning exposure, the relative error amount between the original reference mark 17c2 and substrate reference mark 18c3 is detected by the third position detection system 14c, and the relative error amount between the substrate reference mark 19 and the microscope reference mark 20 which is fixed to the off-axis microscope 15 is detected. The baseline of the off-axis microscope 15 is calculated from these detection results. According to this embodiment, the calculation result of the baseline during exposure can be sent to an arithmetic processing unit (not shown), so that a correction process or correction driving of correcting fluctuation of the baseline during exposure can be performed.

Conventionally, baseline measurement is performed after exposure is ended. According to this embodiment, baseline measurement can be performed or started before exposure is ended. Thus, the throughput of the entire apparatus can be improved.

High-accuracy baseline measurement of the off-axis microscope 16 which is not influenced by the movement of the detection system or stage can be performed.

Figure 9A:
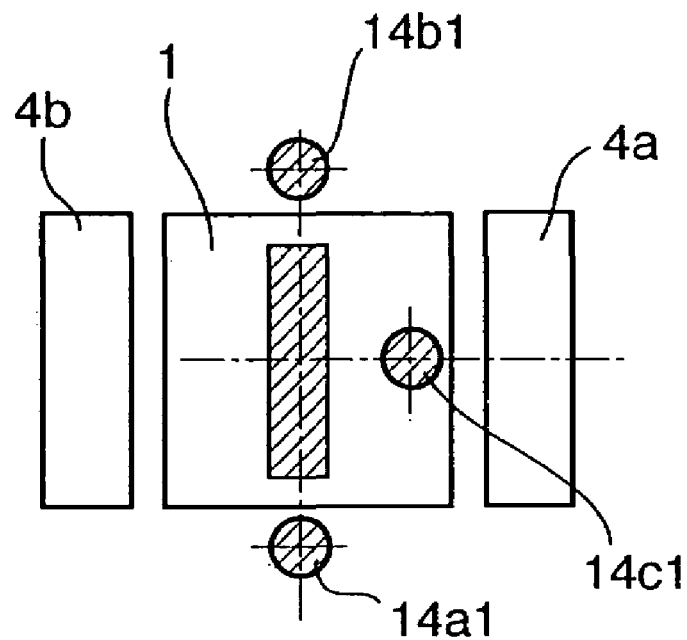
Figure 9B:
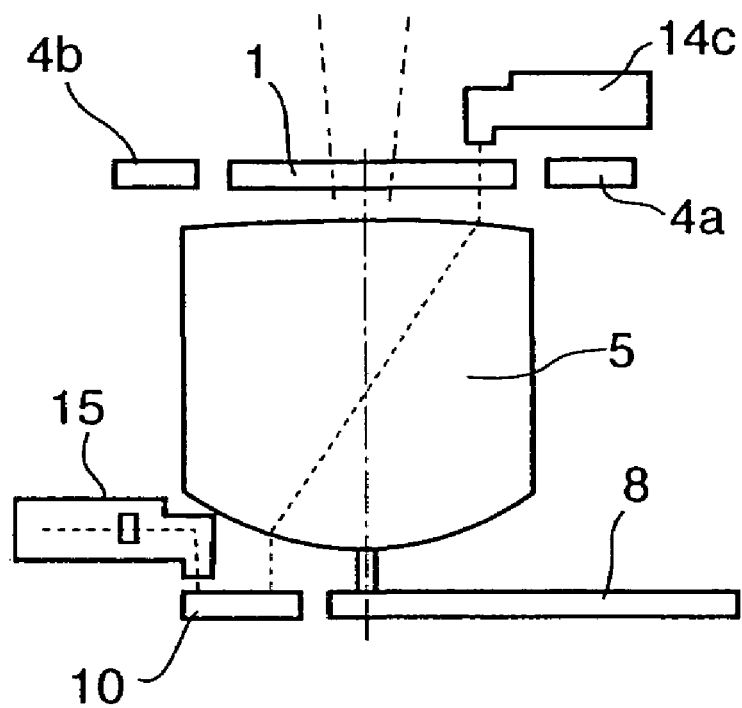

As shown in FIGS. 9A and 9B, in baseline measurement or the like of the scanning exposure apparatus of this embodiment, not the reference original 4a, but the reference original 4b or original 1 can be used.

[Third Detection Method]

The scanning exposure apparatus according to this embodiment includes, as the third detection method of the second position detection means, a method of measuring a difference in travel between the original stage 2 and substrate stage 9 (see FIGS. 1, 5, and 6, and FIGS. 7A and 7B).

The original reference marks 17a3, 17b3, and 17c3 are moved to the detection ranges of the first, second, and third position detection systems 14a, 14b, and 14c by driving the original stage 2. Substantially simultaneously, the substrate reference marks 18a1, 18b1, and 18c1 are moved by driving the substrate stage 9. The relative error amounts between the original reference marks 17a3, 17b3, and 17c3 and the substrate reference marks 18a1, 18b1, and 18c1 are measured by the respective position detection systems, and the respective reference marks are aligned (third step).

The original reference marks 17a1, 17b1, and 17c1 are moved to the detection ranges of the first, second, and third position detection systems 14a, 14b, and 14c by driving the original stage 2. The relative error amounts between the original reference marks 17a1, 17b1, and 17c1 and the substrate reference marks 18a1, 18b1, and 18c1 are measured by the respective position detection systems (fourth step).

The substrate reference marks 18a3, 18b3, and 18c3 are moved to the detection ranges of the first, second, and third position detection systems 14a, 14b, and 14c by driving the substrate stage 9. The relative error amounts between the original reference marks 17a1, 17b1, and 17c1 and the substrate reference marks 18a3, 18b3, and 18c3 are measured by the respective position detection systems (fifth step).

The original reference marks 17a3, 17b3, and 17c3 are moved to the detection ranges of the first, second, and third position detection systems 14a, 14b, and 14c by driving the original stage 2. The relative error amounts between the original reference marks 17a3, 17b3, and 17c3 and the substrate reference marks 18a3, 18b3, and 18c3 are measured by the respective position detection systems (sixth step).

A difference in travel between the original stage 2 and substrate stage 9 is calculated from the results of the third to sixth steps. The difference in travel between the original stage 2 and substrate stage 9 is corrected with the calculation result.

[Fourth Detection Method]

The scanning exposure apparatus according to this embodiment includes, as the fourth detection method of the second position detection means, a method of measuring the tilt (e.g., the rotational position ($\theta$) about the optical axis of the projection optical system) of the original 1 with respect to the original stage 2 (see FIGS. 1, 5, and 6, and FIGS. 10A and 10B).

When performing this measurement, the relative positions of the original 1 and the reference mark which is fixed to the original stage 2 (not shown) are calculated by a microscope (not shown).

A plurality of mark groups 1a, 1b, and 1c that can be detected by the respective position detection systems of the second position detection means 14 are formed on the original 1, which is to be used for this measurement, with a predetermined known size and interval corresponding to the respective detection ranges.

Figure 10A:
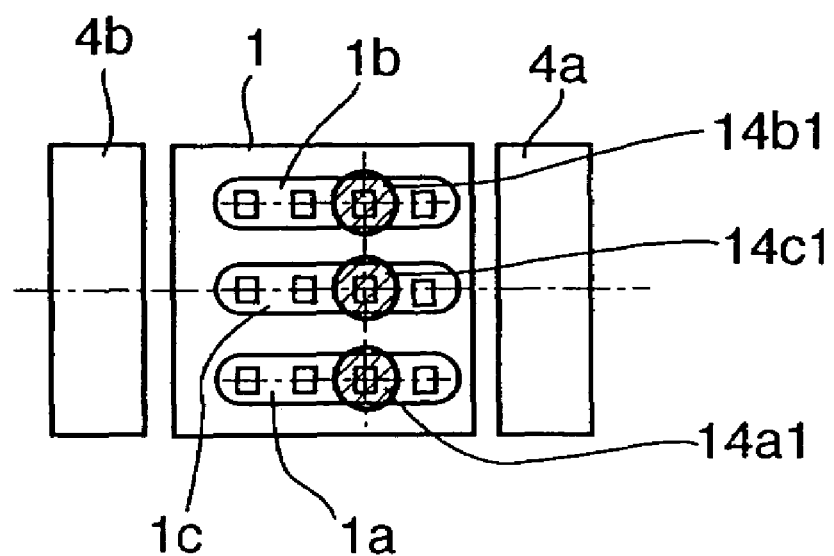
Figure 10B:
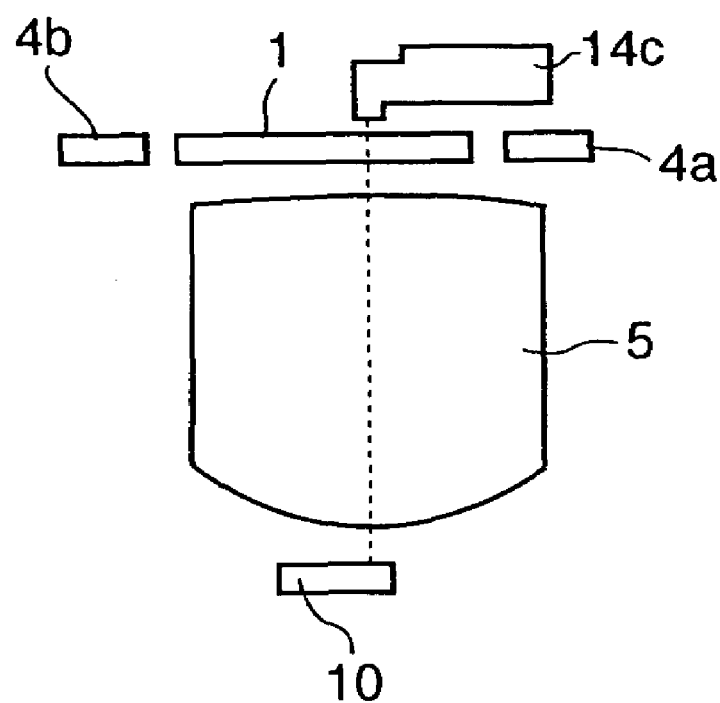

The mark groups 1a, 1b, and 1c which can be observed by the first, second, and third position detection systems 14a, 14b, and 14c, respectively, are formed on the original 1 shown in FIG. 10A. The mark arrays of the respective mark groups are substantially parallel to each other, and their relative distances have known sizes.

The first measurement marks of the mark groups 1a, 1b, and 1c are moved to the respective detection ranges of the first, second, and third position detection systems 14a, 14b, and 14c by driving the original stage 2. Substantially simultaneously, the substrate reference marks 18a1, 18b1, and 18c1 are moved by driving the substrate stage 9. The relative error amounts between the first measurement marks and the substrate reference marks 18a1, 18b1, and 18c1 are measured by the respective position detection systems.

The original stage 2 is scanned to observe the plurality of mark positions of the respective mark groups, so that the relative error amounts between the plurality of mark positions and the substrate reference marks 18a1, 18b1, and 18c1 are measured. The tilt of the original 1 with respect to the original stage 2 is calculated from the detection results of the relative error amounts of the respective marks, the calculation results of the relative positions of the original 1 and the reference marks fixed to the original stage (not shown), and the calculation results of the travels of the original stage 2 and substrate stage 9 detected by the third detection method.

[Fifth Detection Method]

The scanning exposure apparatus according to this embodiment includes, as the fifth detection method of the second position detection means 14, a method of detecting the thermal deformation of a reticle during exposure (see FIGS. 1, 5, and 6, and FIGS. 9A and 9B).

With the scanning exposure apparatus according to this embodiment, the third position detection system 14c can observe the reference substrate 10 even at the wait position during exposure. One or a plurality of marks to be used for this measurement are formed on the original 1. Similarly, one or a plurality of marks to be used for this measurement are formed also on the reference substrate 10. During exposure of any one shot of the shot arrays when the exposure shot array comes the closest to the reference substrate 10, or during movement of the substrate stage 9 among shots, one or the plurality of marks on the original and the marks on the reference substrate can be detected by overlaying.

With this detection, the thermal deformation amount of the reticle during exposure is calculated from a change in distances among the plurality of marks, in mark positions on the original 1 with reference to the marks on the reference substrate 10, or in shapes of the marks. A process of compensating for the thermal deformation of the reticle is performed on the basis of the calculation result.

Effect of the Embodiment

According to this embodiment, the third position detection system 14c is newly provided to the second position detection means 14. Thus, compared to the conventional case wherein detection is performed with the two position detection systems 14a and 14b, high-accuracy calculation of the origin offset of the substrate stage 9, and high-accuracy position measurement in, e.g., baseline measurement concerning the off-axis microscope 15 or an off-axis microscope 16, measurement of the relative travel error between the original stage 2 and substrate stage 9, and tilt measurement of the original 1 with respect to the original stage 2, can be performed.

The third position detection system 14c can perform detection on the optical axis of the projection optical system with light having substantially the same wavelength as that of the exposure light through the projection optical system. Thus, high-accuracy position detection can be performed.

In baseline measurement or the like, since the third position detection system 14c can perform measurement at the wait position for exposure without moving the substrate stage, it can perform high-speed position detection. Simultaneously, since a driving error can be eliminated or reduced, high-accuracy position detection can be performed.

The detection position of the third position detection system 14c is located not only within the exposure region but also outside it. Thus, in baseline measurement or the like, the original stage 2 need not be driven, or the driving amount of the original stage 2 can be reduced, so that the throughput of the apparatus can be improved. Simultaneously, since the driving error can be eliminated or reduced, high-accuracy position detection can be performed.

The detection position of the third position detection system 14c is located not only within the exposure region but also outside it. Thus, in baseline measurement or the like, the third position detection system 14c need not be driven, or the driving amount of the third position detection system 14c can be reduced, so that the throughput of the entire apparatus can be improved. Simultaneously, since the driving error can be eliminated or reduced, high-accuracy position detection can be performed.

The detection range of the third position detection system 14c is located between the optical path of the exposure light and the detection range of the off-axis microscope 15 (including the two ends). Thus, in baseline measurement, the driving amount for driving the original stage 2 or substrate stage 9, or both of them can be reduced or eliminated, and high-speed, high-accuracy position detection can be performed. Thus, the throughput of the apparatus can be improved, and high-accuracy overlaying exposure can be performed.

Baseline measurement concerning the off-axis microscope 15 or 16 can be performed without moving the original stage 2 or substrate stage 9, or both of them, and the detection range of the third position detection system 14c from the exposure end positions. Therefore, high-speed, high-accuracy position detection can be performed, so that the throughput of the apparatus can be improved, and high-accuracy overlaying exposure can be performed.

Base measurement or the like can be performed during exposure by using the third position detection system 14c. Thus, the throughput of the apparatus can be improved.

The deformation amount of the reticle caused by exposure heat or the like can be detected by using the third position detection system 14c. Thus, high-accuracy overlaying exposure can be performed.

[Device Manufacturing Method]

Figure 13:
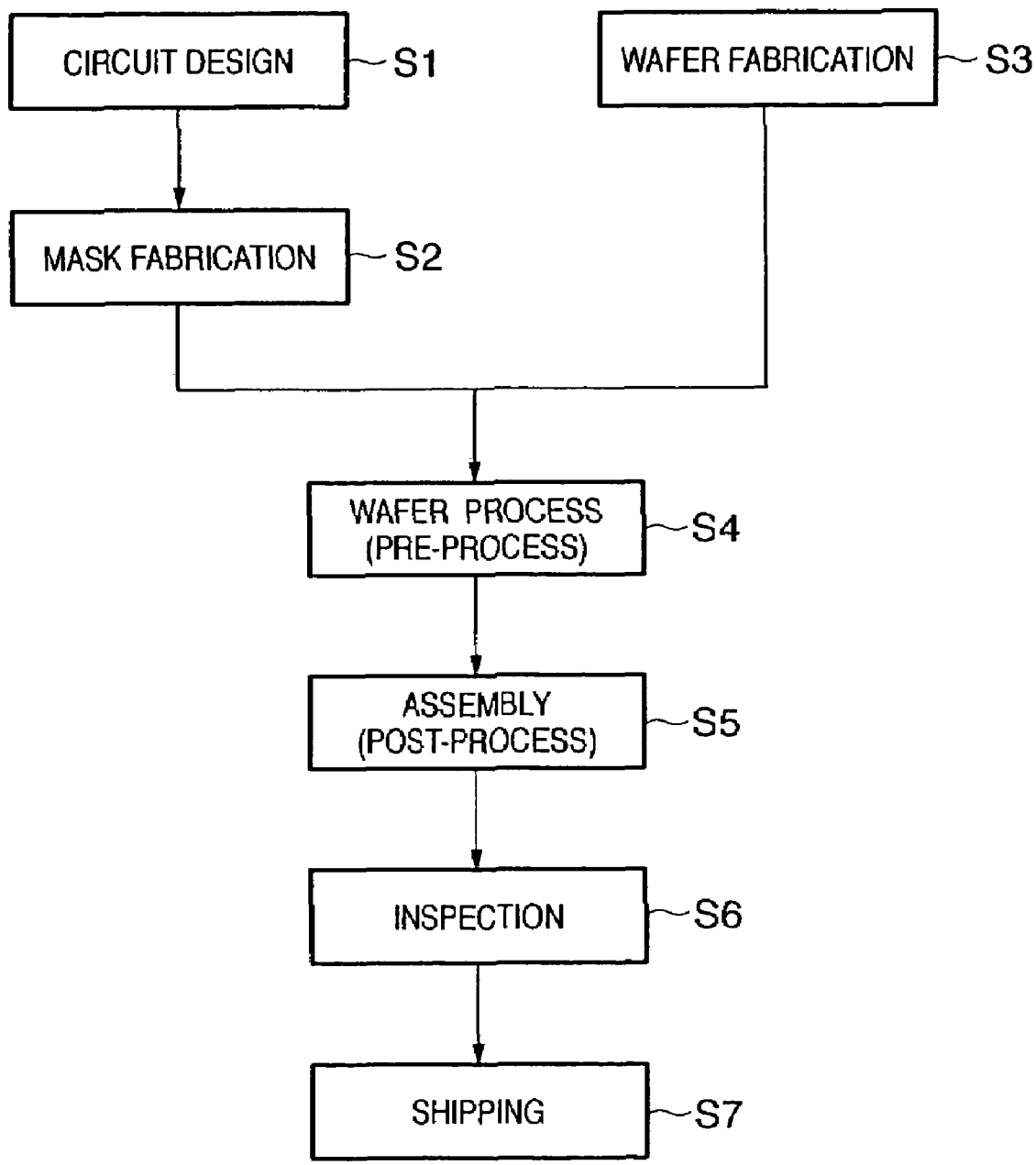
FIG. 13 is a flow chart showing the flow of an overall semiconductor device manufacturing process.

A process of manufacturing a semiconductor device as an example of a device such as a microdevice will be described. FIG. 13 shows the flow of the overall semiconductor device manufacturing process. In step 1 (circuit design), circuit design of the semiconductor device is performed. In step 2 (mask fabrication), a mask is fabricated on the basis of the designed circuit pattern.

In step 3 (wafer fabrication), a wafer is manufactured using a material such as silicon. In step S4 (wafer process) called a preprocess, an actual circuit is formed on the wafer by lithography with the above exposure apparatus using the prepared mask and wafer. In step S5 (assembly) called a post-process, a semiconductor chip is formed from the wafer fabricated in step S5. This step includes processes such as assembly (dicing and bonding) and packaging (chip encapsulation). In step S6 (inspection), inspections including operation check test and durability test of the semiconductor device manufactured in step 5 are performed. A semiconductor device is completed with these processes, and shipped in step S7.

The wafer process of step S4 includes the following steps: an oxidation step of oxidizing the surface of the wafer, a CVD step of forming an insulating film on the wafer surface, an electrode formation step of forming an electrode on the wafer by deposition, an ion implantation step of implanting ions into the wafer, a resist processing step of applying a photosensitive agent to the wafer, an exposure step of transferring the circuit pattern onto the wafer after the resist processing step by the exposure apparatus, a developing step of developing the wafer exposed in the exposure step, an etching step of etching portions other than the resist image developed in the developing step, and a resist peeling step of removing any unnecessary resist remaining after etching. By repeating these steps, a multilayered structure of circuit patterns is formed on the wafer.

Other Embodiment

The above embodiments are realized when the program of software that realizes a function such as measurement or compensation function of the above embodiments is supplied to the system or the apparatus directly, or by remote control, and the computer of the system or apparatus reads and performs the supplied program code. In this case, the embodiment need not be a program as far as it retains the function of the program.

Therefore, to realize the function and process of the present invention with the computer, the program code itself which is to be installed in the computer can constitute the embodiment of the present invention.

In this case, the program can take any shape, e.g., an object code, a program which is to be performed by an interpreter, or script data to be supplied to the OS, as far as it retains the function of the program.

A recording medium used for supplying the program can be, e.g., a flexible disk, a hard disk, an optical disk, a magneto-optical disk, an MO, a CD-ROM, a CD-R, a CD-RW, a magnetic tape, a nonvolatile memory card, a ROM, a DVD (DVD-ROM, DVD-R), or the like.

A method of supplying the program includes allowing the user to connect to a homepage on the Internet using the browser of the client computer, and to download a computer program itself, or a compressed file containing an automatic installation function from the homepage to a recording medium such as a hard disk. Also, the program code constituting the program of the present invention can be divided into a plurality of files, and the respective files can be downloaded from different homepages. In other words, a WWW server for allowing a plurality of users to download a program file that realizes the function and process of the present invention with a computer can also constitute the embodiment of the present invention.

The program can be encrypted and stored in a storage medium such as a CD-ROM. The storage medium can be distributed to the user. A user who satisfies predetermined conditions can be allowed to download key information for decryption from a homepage through the Internet. The user can decrypt the program by using the key information, and can install the decrypted program in the computer.

The OS or the like running on the computer may perform part or all of the actual process in response to the commands of the program. For example, when the computer performs the readout program, the function of the embodiment described above is realized. The function of the embodiment described above may be realized by this process.

Furthermore, the program read out from the recording medium may be written in a memory provided to a function expansion board inserted in the computer or a function expansion unit connected to the computer. After that, a CPU or the like provided to the function expansion board or function extension unit may perform part or all of the actual process. The function of the embodiment described above may be realized by this process.

The present invention is not limited to the above embodiments and various changes and modifications can be made within the spirit and scope of the present invention. Therefore, to apprise the public of the scope of the present invention the following claims are made.

What is claimed is:

1. An exposure apparatus for performing an exposure of a substrate to a pattern of an original while the original and the substrate are scanned in a scanning direction, said apparatus comprising:

an original stage configured to hold the original and to move;

a projection optical system configured to project light from the original onto the substrate; and a first detector configured to move in the scanning direction separately from said original stage and to detect a position of a first substrate reference mark corresponding to the substrate through said projection optical system, said first detector being configured to detect the position of the first substrate reference mark from a selective one of an on-axis position on an optical axis of said projection optical system and an off-axis position apart from the optical axis in the scanning direction, wherein the original and the substrate are aligned based on the position of the first substrate reference mark detected by said first detector.

2. An apparatus according to claim 1, further comprising a substrate stage configured to hold the substrate and to move, wherein the first substrate reference mark is formed on said substrate stage.

3. An apparatus according to claim 1, wherein said first detector is configured to detect a positional error between an original reference mark corresponding to the original and the first substrate reference mark.

4. An apparatus according to claim 1, further comprising a second detector configured to detect a position of a second substrate reference mark corresponding to the substrate through said projection optical system from an off-axis position apart from the optical axis in a direction perpendicular to the scanning direction.

5. An apparatus according to claim 1, wherein the original and the substrate are aligned based on the position of the first substrate reference mark detected by said first detector and the position of the second substrate reference mark detected by said second detector.

6. An apparatus according to claim 1, further comprising a non-TTL off-axis microscope configured to detect a position of a non-TTL off-axis substrate reference mark corresponding to the substrate, not through said projection optical system.

7. An apparatus according to claim 6, wherein a correction value with respect to said non-TTL off-axis microscope is calculated based on the position of the first substrate reference mark detected by said first detector and the position of the non-TTL off-axis substrate reference mark detected by said non-TTL off-axis microscope.

8. An apparatus according to claim 1, further comprising a TTL off-axis microscope configured to detect a position of a TTL off-axis substrate reference mark corresponding to the substrate, through said projection optical system.

9. An apparatus according to claim 8, wherein a correction value with respect to said TTL off-axis microscope is calculated based on the position of the first substrate reference mark detected by said first detector and the position of the TTL off-axis substrate reference mark detected by said TTL off-axis microscope.

10. An apparatus according to claim 1, wherein an origin offset of said original stage is calculated based on the position of the first substrate reference mark detected by said first detector.

11. An apparatus according to claim 3, wherein a difference in travel between the original and the substrate is corrected based on the positional error detected by said first detector.

12. An apparatus according to claim 1, wherein said first detector is configured to detect a positional error between a measurement mark formed on the original and the first substrate reference mark.

13. An apparatus according to claim 12, wherein a rotational position of the original with respect to the optical axis of said projection optical system is calculated based on the positional error detected by said first detector.

14. An apparatus according to claim 1, wherein said first detector is configured to detect the first substrate reference mark from the off-axis position during exposure.

15. An apparatus according to claim 14, further comprising a non-TTL off-axis microscope configured to detect a third non-TTL off-axis substrate reference mark corresponding to the substrate, not through said projection optical system, wherein said non-TTL off-axis microscope is configured to detect the non-TTL off-axis substrate reference mark with respect to the same position of the substrate as the position with respect to which said first detector detects the first substrate reference mark.

16. An apparatus according to claim 15, wherein a correction value with respect to said non-TTL off-axis microscope is calculated based on the position of the first substrate reference mark detected by said first detector and the position of the non-TTL off-axis substrate reference mark detected by said non-TTL off-axis microscope.

17. An apparatus according to claim 1, wherein said first detector is configured to detect the first substrate reference mark using having a wavelength, which is substantially the same as a wavelength of light used for the exposure.

18. An apparatus according to claim 1, further comprising a third detector configured to detect a third substrate reference mark corresponding to the substrate, through said projection optical system from an off-axis position apart from the optical axis in a direction perpendicular to the scanning direction, wherein said first, second and third detectors are configured to detect the first, second and third substrate reference marks using light having a wavelength, which is substantially the same as a wavelength of light used for the exposure, respectively.

19. A method of manufacturing a device, said method comprising steps of:

exposing a substrate to a pattern of an original using an exposure apparatus as defined in claim 1;

developing the exposed substrate; and processing the developed substrate to manufacture the device.

20. An apparatus according to claim 1, wherein said first detector is configured to detect a mark formed on the original from the off-axis position during the exposure, and a deformation amount of the original is calculated based on the position of the mark formed on the original detected by said first detector.

* * * * *

UNITED STATES PATENT AND TRADEMARK OFFICE
CERTIFICATE OF CORRECTION

PATENT NO. : 7,218,379 B2 Page 1 of 1
APPLICATION NO. : 11/130174
DATED : May 15, 2007
INVENTOR(S) : Yuichi Osakabe et al.

It is certified that error appears in the above-identified patent and that said Letters Patent is hereby corrected as shown below:

ON THE TITLE PAGE:
 In item "(57) ABSTRACT," line 6, "on/at" should read -- on --.
 In item "(57) ABSTRACT," line 7, "optical and" should read -- optical system and --.

COLUMN 4:
 Line 25, "close" should read -- closely --.

COLUMN 11:
 Line 7, "14c." should read -- 14c. Alternatively, --
 Line 8, "Alternatively," should be deleted and the left margin should be closed up.

COLUMN 13:
 Line 36, "can-perform" should read -- can perform --.

COLUMN 16:
 Line 55, "and the" should read -- and using the --.

Signed and Sealed this

Fourth Day of December, 2007

JON W. DUDAS
*Director of the United States Patent and Trademark Office*